United States Patent
Pupalaikis et al.

(10) Patent No.: US 10,768,211 B2
(45) Date of Patent: Sep. 8, 2020

(54) SYSTEM AND METHOD FOR CURRENT SENSE RESISTOR COMPENSATION

(71) Applicant: Oracle International Corporation, Redwood Shores, CA (US)

(72) Inventors: Peter J. Pupalaikis, Ramsey, NJ (US); Lawrence W. Jacobs, Redwood Shores, CA (US); Istvan Novak, Bedford, MA (US)

(73) Assignee: Oracle International Corporation, Redwood Shores, CA (US)

( * ) Notice: Subject to any disclaimer, the term of this patent is extended or adjusted under 35 U.S.C. 154(b) by 300 days.

(21) Appl. No.: 15/962,955

(22) Filed: Apr. 25, 2018

(65) Prior Publication Data

US 2019/0064231 A1    Feb. 28, 2019

Related U.S. Application Data

(60) Provisional application No. 62/550,481, filed on Aug. 25, 2017.

(51) Int. Cl.
| | |
|---|---|
| *G01R 19/25* | (2006.01) |
| *G01R 31/40* | (2020.01) |
| *G01R 15/00* | (2006.01) |

(52) U.S. Cl.
CPC ..... *G01R 19/2509* (2013.01); *G01R 19/2516* (2013.01); *G01R 31/40* (2013.01); *G01R 15/005* (2013.01)

(58) Field of Classification Search
CPC ............ G01R 19/2509; G01R 19/2516; G01R 31/40; G01R 15/005
See application file for complete search history.

(56) References Cited

U.S. PATENT DOCUMENTS

| | | |
|---|---|---|
| 5,579,299 A | 11/1996 | Halter et al. |
| 5,691,635 A | 11/1997 | Pot et al. |
| 6,351,112 B1 | 2/2002 | Felps et al. |
| 6,701,335 B2 | 3/2004 | Pupalaikis |
| 6,725,170 B1 | 4/2004 | Hickman |
| 6,856,126 B2 | 2/2005 | McTigue et al. |
| 6,870,359 B1 | 3/2005 | Sekel |
| 7,180,314 B1 | 2/2007 | Sekel |

(Continued)

OTHER PUBLICATIONS

Smolyansky, D.A. et al., "Characterization of differential interconnects from time domain reflectometry measurements", TDA Systems Inc. Published in Microwave Journal. vol. 43, No. 3, (2000),1-6.

(Continued)

*Primary Examiner* — Mohammad K Islam
(74) *Attorney, Agent, or Firm* — Invoke

(57) ABSTRACT

Systems and methods are provided for compensating for parasitics in current measurements utilizing series current sense resistors. In one or more embodiments, the techniques include connecting a probe to a terminal of a circuit and a waveform measuring device. A waveform measuring device then acquires, through the probe, a voltage waveform. A virtual probe netlist is generated, where the netlist is descriptive of a series resistance and associated parasitics. A virtual probe processor converts, based on the virtual probe netlist, the voltage waveform to a current waveform representative of a current in the circuit.

20 Claims, 7 Drawing Sheets

(56) References Cited

U.S. PATENT DOCUMENTS

| | | | |
|---|---|---|---|
| 7,233,967 | B2 | 6/2007 | Sureka |
| 7,408,363 | B2 | 8/2008 | Tan et al. |
| 8,289,037 | B2 | 10/2012 | Labib et al. |
| 8,854,026 | B2 | 10/2014 | Karlsson et al. |
| 9,298,872 | B2* | 3/2016 | Nam .................. H01L 21/00 |
| 2002/0065643 | A1* | 5/2002 | Hirano ............. G06F 30/367 |
| | | | 703/19 |
| 2003/0057966 | A1* | 3/2003 | Shimazaki ......... G01R 31/002 |
| | | | 324/628 |
| 2004/0223349 | A1 | 11/2004 | Nash |
| 2005/0185768 | A1 | 8/2005 | Pickerd et al. |
| 2005/0185769 | A1 | 8/2005 | Pickerd et al. |
| 2005/0265725 | A1 | 12/2005 | Okano et al. |
| 2006/0048081 | A1* | 3/2006 | Kiel .................. G06F 30/367 |
| | | | 716/102 |
| 2006/0098987 | A1 | 5/2006 | Hoshida |
| 2006/0129954 | A1* | 6/2006 | Schuppe .............. G06F 30/33 |
| | | | 716/109 |
| 2007/0189176 | A1 | 8/2007 | Milne et al. |
| 2007/0220357 | A1 | 9/2007 | Vedanabhatla et al. |
| 2007/0274015 | A1 | 11/2007 | Isham |
| 2008/0048673 | A1 | 2/2008 | Tan et al. |
| 2008/0048677 | A1 | 2/2008 | Tan et al. |
| 2008/0052028 | A1 | 2/2008 | Pickerd et al. |
| 2008/0059923 | A1* | 3/2008 | Sasaki ................. G06F 30/33 |
| | | | 716/107 |
| 2008/0216038 | A1* | 9/2008 | Bose ................. G06F 30/392 |
| | | | 716/118 |
| 2009/0146643 | A1 | 6/2009 | Ostrom et al. |
| 2009/0282378 | A1* | 11/2009 | Tanaka .............. G06F 30/367 |
| | | | 716/113 |
| 2009/0313596 | A1* | 12/2009 | Lippmann ........... G06F 30/327 |
| | | | 716/126 |
| 2010/0213897 | A1 | 8/2010 | Tse |
| 2010/0250187 | A1* | 9/2010 | Zuber ............... G06F 30/367 |
| | | | 702/179 |
| 2012/0139518 | A1 | 6/2012 | Cleveland et al. |
| 2012/0194161 | A1 | 8/2012 | Latham et al. |
| 2013/0047133 | A1* | 2/2013 | Alam .................. G06F 30/33 |
| | | | 716/136 |
| 2013/0125072 | A1* | 5/2013 | Newcomb ............. G06F 30/30 |
| | | | 716/107 |
| 2013/0147452 | A1 | 6/2013 | Yang et al. |
| 2014/0172345 | A1* | 6/2014 | Stoker .................. G01N 21/95 |
| | | | 702/117 |
| 2015/0193569 | A1* | 7/2015 | Tam .................. G06F 30/398 |
| | | | 716/113 |
| 2015/0269297 | A1* | 9/2015 | Tuan .................. G06F 30/367 |
| | | | 716/106 |
| 2015/0377958 | A1* | 12/2015 | Ukraintsev ............ G01Q 30/02 |
| | | | 324/750.18 |
| 2016/0111958 | A1 | 4/2016 | Choi et al. |

OTHER PUBLICATIONS

Long, D.G. "Exact computation of the unwrapped phase of a finite-length time series", IEEE Trans. Acoust., Speech, Signal Processing, vol. 36, No. 11, (Nov. 1988),1787-1790.

Kurokawa, K "Power Waves and the Scattering Matrix", IEEE Trans. Microwave Theory Tech., vol. MTT-13, (Mar. 1965),194-202.

Fan, W et al., "Mixed-Mode S-Parameter Characterization of Differential Structures", IEEE 2003 Electronics Packaging Technology Conference, (2003),533-537.

Bockelman, D.E. et al., "Combined Differential and Common-mode Scattering Parameters: Theory and Simulation", IEEE Trans. Microwave Theory Tech., vol. 43, (Jul. 1995),1530-1539.

"WaveLink probe system", LeCroy Corporation, (Sep. 2005),1-8.

"Three and four port s-parameters": calibrations and mixed mode parameters, Anritsu Application Note, 11410-00279, (Nov. 2001),1-16.

"S-Parameter Techniques for Faster, More Accurate Network Design", Hewlett Packard Test & Measurement Application Note 95-1, (1996),1-79.

"S-Parameter Design", Agilent Application Note 154 (5852-1087), (Mar. 1990),1-44.

"Restoring Confidence in Your High-Bandwidth Probe Measurements", Agilent Application Note 1419-01, (Nov. 2002),1-6.

"Performance Comparison of Differential and Single-Ended Active Voltage Probes", Agilent Application Note 1419-03, (Nov. 2002),1-12.

"Network Communication Physical Layer Testing with a CSA7000 Series Communications Signal Analyzer", Tektronix Application Note 55W-15028-0, (2001),1-12.

"Improving Usability and Performance in High-Bandwidth Active Oscilloscope Probes", Agilent Application Note 1419-02, (Nov. 2002),1-12.

* cited by examiner

```
 1  device L1 2 L 1.2e-06
 2  device R1 2 R 0.002
 3  device R2 1 R 1.0
 4  device L2 2 L 1e-10
 5  device L3 2 L 1.2e-06
 6  device R3 2 R 0.002
 7  device R4 1 R 1.0
 8  device D1 4 voltagecontrolledvoltagesource 500.0
 9  device G1 1 ground
10  device O1 1 open
11  device G2 1 ground
12  device D2 4 voltagecontrolledvoltagesource 500.0
13  device G3 1 ground
14  device O2 1 open
15  connect G2 1 L1 1 L3 1
16  stim m1 G2 1
17  connect L1 2 D1 2 R1 1
18  connect L2 1 R1 2
19  connect R2 1 D1 1 L2 2
20  connect D2 2 L3 2 R3 1
21  connect R3 2 R4 1 D2 1
22  connect G1 1 D1 3
23  meas O1 1
24  output O1 1
25  connect O1 1 D1 4
26  connect D2 3 G3 1
27  output O2 1
28  connect O2 1 D2 4
```

FIG. 8

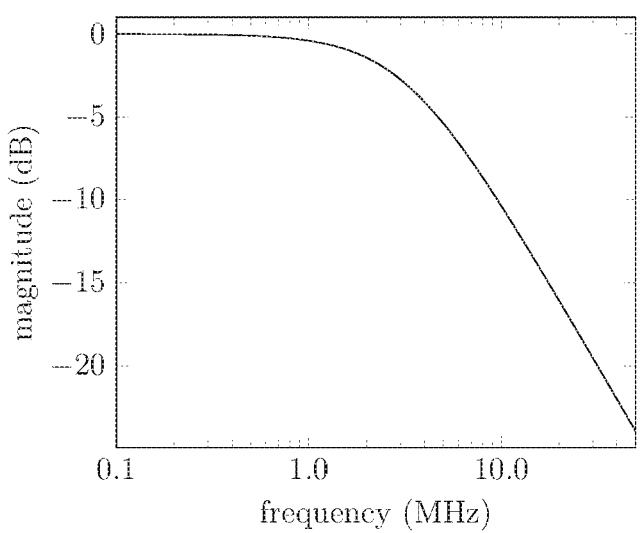

FIG. 9

SYSTEM AND METHOD FOR CURRENT SENSE RESISTOR COMPENSATION

BENEFIT CLAIMS; RELATED APPLICATIONS; INCORPORATION BY REFERENCE

This application claims the benefit of U.S. Provisional Patent Application 62/550,481, filed Aug. 25, 2017, which is hereby incorporated by reference.

This application is related to U.S. application Ser. No. 15/803,309, titled "INDUCTOR CURRENT MEASUREMENT PROBE", filed Nov. 3, 2017; U.S. application Ser. No. 15/721,151, titled "TEST TOOL FOR POWER DISTRIBUTION NETWORKS", filed Sep. 29, 2017; U.S. Pat. No. 7,660,685, titled "VIRTUAL PROBING"; and U.S. Pat. No. 8,170,820, also titled "VIRTUAL PROBING"; the entire contents for each of which are incorporated herein by reference.

TECHNICAL FIELD

The present disclosure relates to the measurement of current, especially the measurement of current in a phase of a switch-mode power supply. The present disclosure further relates to the measurement of current using a series sense resistor, especially when the sense resistor value is small relative to parasitics.

BACKGROUND

There are many methods of measuring current in a conductor. One approach is to measure the strength of the magnetic field surrounding the wire. This approach involves surrounding the current carrying conductor with a core containing windings to form a transformer. This approach has drawbacks because current probes of this type are bulky, relatively expensive and may not necessarily work at DC.

The measurement of current is particularly useful in switch-mode power supplies where the phase current flows through an inductor where one side of the inductor may be switched. For example, in a buck regulator, one side of an inductor is alternately switched between an input voltage and typically ground causing the rate of change of current flow to switch alternately between positive and negative values. Here, the inductor serves as a kind of flywheel. Measuring the time varying current flow through a phase inductor is useful for many reasons, especially when multiple phases are interleaved. In a multi-phase supply, the analysis of the current through each phase inductor is very useful for the study of current sharing in the supply, but even in single phase supplies, the output current is monitored in current mode feedback scenarios.

In U.S. application Ser. No. 15/803,309, previously incorporated by reference, a method and apparatus is put forth for measuring current through a switching power supply phase by processing the differential voltage measured across an inductor in a phase of the supply. This method is very useful, but other ways may be desirable, especially when trying to correlate measurements.

In some situations, a series sense resistor is available. Sometimes the series sense resistor is already included in a device under test (DUT) and is itself parasitic in nature, like the resistance of a printed circuit board (PCB) trace, a via, or a pin. In other cases, the series sense resistor is introduced through added circuitry used to capture test measurements from the DUT. Either way, this is a resistance, typically small valued, in series with a circuit path where current measurement is wanted. The resistor is typically as small as possible because any current delivered by the path causes power to be dissipated in the resistor according the well known equation: $P=I^2R$. Furthermore, there is a voltage drop across the resistor of: $V=I \cdot R$. Generally, a small resistance value is preferred to minimize the effects of the measurement circuitry on the output. However, in current sense applications, the voltage drop must be large enough to be measured by a differential voltage probe. The differential voltage balancing act typically involves a sense resistor value on the order of a milliohm ($m\Omega$) for a current measurement in a supply on the order of ten amps.

With such a small resistance value, a problem that arises is that of parasitics. A parasitic is an unwanted and usually unremovable extra circuit element in the model of the element. A wire has parasitics in the form of some resistance, and also generates an electric field between other wires and ground causing the wire to have some capacitance. Furthermore, current flowing through a wire causes a magnetic field to develop that leads to inductance. At low frequencies and for large values of resistance for a resistor component, the parasitic resistance, capacitance and inductance can often be neglected, but for higher frequencies and small values of resistance, the parasitics can cause very poor measurements of current when differential voltage is used to infer current flow. Inaccurate measurements may have significant implications for the design, analysis, validation, and debugging of various electronic circuits. In the context of switch-mode power supplies (SMPS), for example, faulty measurements may lead to poor design choices, potentially compromising the stability and power integrity of the device.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

The embodiments are illustrated by way of example and not by way of limitation in the figures of the accompanying drawings. It should be noted that references to "an" or "one" embodiment in this disclosure are not necessarily to the same embodiment, and they mean at least one. In the drawings:

FIG. 8 is a virtual probe netlist in accordance with one or more embodiments;

FIG. 9 is a plot of the magnitude response of a virtual probe transfer function in accordance with one or more embodiments;

DETAILED DESCRIPTION

Figure 1:
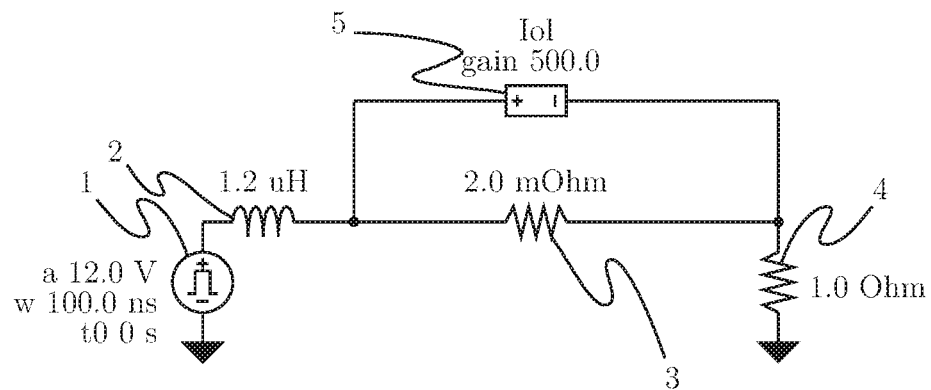
FIG. 1 is a schematic showing current sensing measurement in a DC-DC power supply.

In the following description, for the purposes of explanation, numerous specific details are set forth in order to provide a thorough understanding. One or more embodiments may be practiced without these specific details. Features described in one embodiment may be combined with features described in a different embodiment. In some examples, well-known structures and devices are described with reference to a block diagram form in order to avoid unnecessarily obscuring the present invention.

1. GENERAL OVERVIEW
2. PARASITICS IN CURRENT SENSE MEASUREMENTS
3. CURRENT SENSE RESISTOR COMPENSATION USING VIRTUAL PROBING
4. COMPENSATION TUNING
5. MISCELLANEOUS; EXTENSIONS

1. General Overview

Techniques described herein provide systems and methods for compensation of parasitics. The systems and methods allow for measurements errors of current involving series sense resistors to be overcome.

In one or more embodiments, the dominant parasitic effect is that of unwanted parasitic inductance where the parasitic inductance value is known. In this scenario, a system may compensate for the parasitic inductance by generating a virtual probe netlist comprising a measurement portion and an output portion. The measurement portion may include or consist of a circuit containing preferably a phase inductor, an ideal sense resistor, and a load. The output portion may include or consist of a circuit containing preferably the phase inductor, the load, and the actual circuit of the actual sense resistor model. The actual circuit in this context includes or consists of the sense resistor and associated parasitics.

In one or more embodiments, the output and measurement portion of the circuit are joined by a common stimulus. In the measurement portion, a measurement probe provides the location where an actual measurement is taken. In the output portion, an output probe provides the location where the desired, compensated waveform is provided.

In one or more embodiments, virtual probing is used to compensate for parasitics. Virtual probing allows measurements to be provided that are present at any other point in a circuit other than where the probe tips are able to be connected. Virtual probing may be used to determine a transfer function and resulting processing function for converting measured waveforms into compensated output waveforms that more closely represent the actual current.

In one or more embodiments, the systems and methods provided herein compensate for other forms of parasitics, such as parasitic capacitance and/or parasitic resistance, in addition to or as an alternative to parasitic inductance.

In one or more embodiments, tuning capabilities are provided to tune or trim the parasitics until a correct waveform is identified. Tuning may be performed automatically, such as by a waveform processor, or may be exposed through an interface to a user. The system may be automatically tuned until the characteristics of the waveforms meet expected characteristics, such as expected Fourier components in a calibration step. The waveforms may be output on the display of a oscilloscope or computing device as a representation of current in a phase of a switch-mode power supply.

2. Parasitics in Current Sense Measurements

FIG. 1 depicts a simplified circuit where a current sense measurement is performed in a single phase of a switch-mode power supply. In this particular supply, the input voltage is around 12 Volts and the output voltage is desired to be 1 Volt. This arrangement is referred to as a buck power supply. A phase of the supply supplies current through an inductor [2] to a load exemplified by a load resistor [4]. The switching of the supply during one switching cycle is exemplified by the voltage pulse generator [1], which delivers a 100 nanosecond (ns) wide voltage pulse swinging between ground and 12 Volts. Here, a sense resistor [3] with a 2 mΩ ideal value has been placed in series with the inductor [2] in a goal of measuring the current through this single phase. Any current flowing through the inductor [2] also flows through the sense resistor [3] developing a differential voltage across the sense resistor [3]. Shunting the sense resistor [3] is a differential voltage probe [5]. Since the sense resistor [3] has an ideal value of 2 mΩ, a transconductance value of 500 transforms the differential voltage measurement to a measurement of current.

Figure 2:
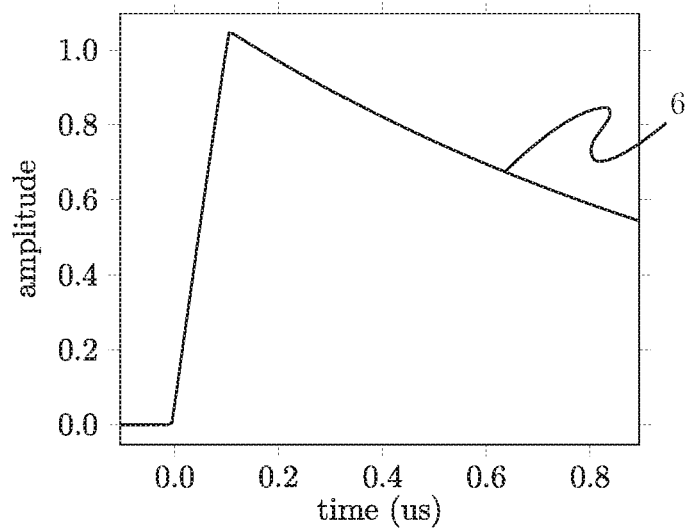
FIG. 2 is a plot of a desired current waveform from a current sensing measurement.

FIG. 2 is a plot of a desired current waveform [6] from a current sensing measurement. In an oscilloscope measuring the current in the arrangement depicted in FIG. 1, the voltage waveform acquired from the differential voltage probe [5] is scaled by 500 to produce the desired current sense waveform [6] as shown.

Figure 3:
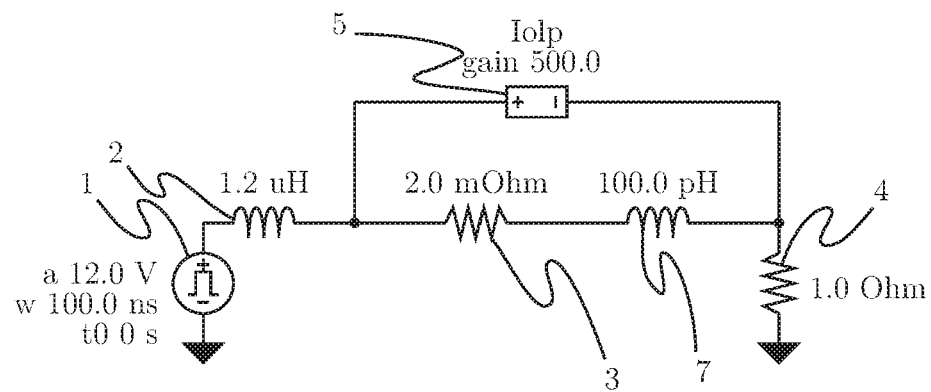
FIG. 3 is a schematic showing a typical current sensing measurement situation in a DC-DC power supply where the sense resistor contains unwanted parasitic inductance.

FIG. 3 is a schematic showing a current sensing measurement situation in a DC-DC power supply where the sense resistor contains unwanted parasitic inductance. The schematic represents a circuit exemplifying a practical aspect of attempting to utilize such a small value for a sense resistor [3]. The schematic of FIG. 3 has the same circuit elements to the schematic in FIG. 1, but also includes a very tiny parasitic inductance [7] with a value of 100 picohenries (pH). This parasitic inductance value is on the order of typical parasitic inductances. For applications where the series resistance is much larger, the parasitic inductance [7] would not have a significant impact. However, due to the small resistance value, the parasitic inductance [7] complicates current measurements as illustrated below.

The impedance of an inductor is given by the well-known equation:

$$V = s \cdot L = j \cdot 2\pi \cdot f \cdot L$$

where s is the Laplace variable, L is the inductance in henries and f is the frequency in hertz (Hz). Using this equation, it may be seen that for frequencies over about 3 MHz, the impedance of the parasitic inductance is higher than the desired resistance.

Figure 4:
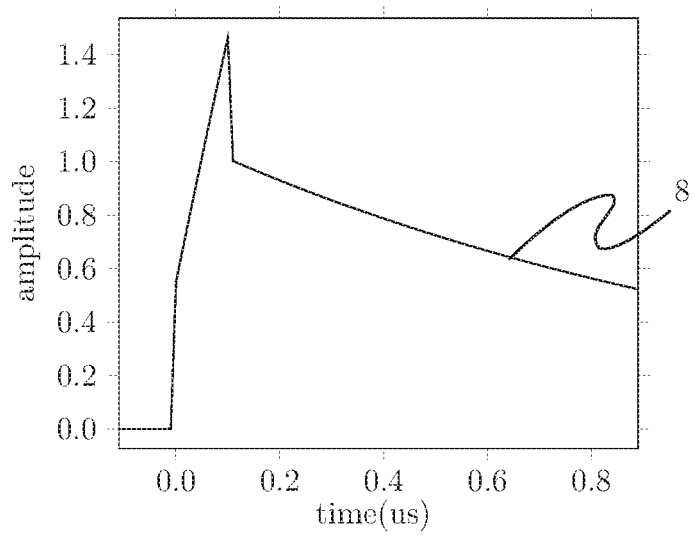
FIG. 4 is a plot of an incorrect current waveform from a current sensing measurement affected by parasitic inductance.

FIG. 4 is a plot of an incorrect current sense waveform [8] from a current sensing measurement affected by parasitic inductance. In particular, the current sense waveform [8] is generated from the current sensing measurement, but does not compensate for parasitic inductance in the switch-mode regulator. The current sense waveform [8] significantly differs with the desired current sense waveform [6] as shown in FIG. 2 and would not provide a very precise current measurement, especially when the switch-node is switching continuously.

Figure 5:
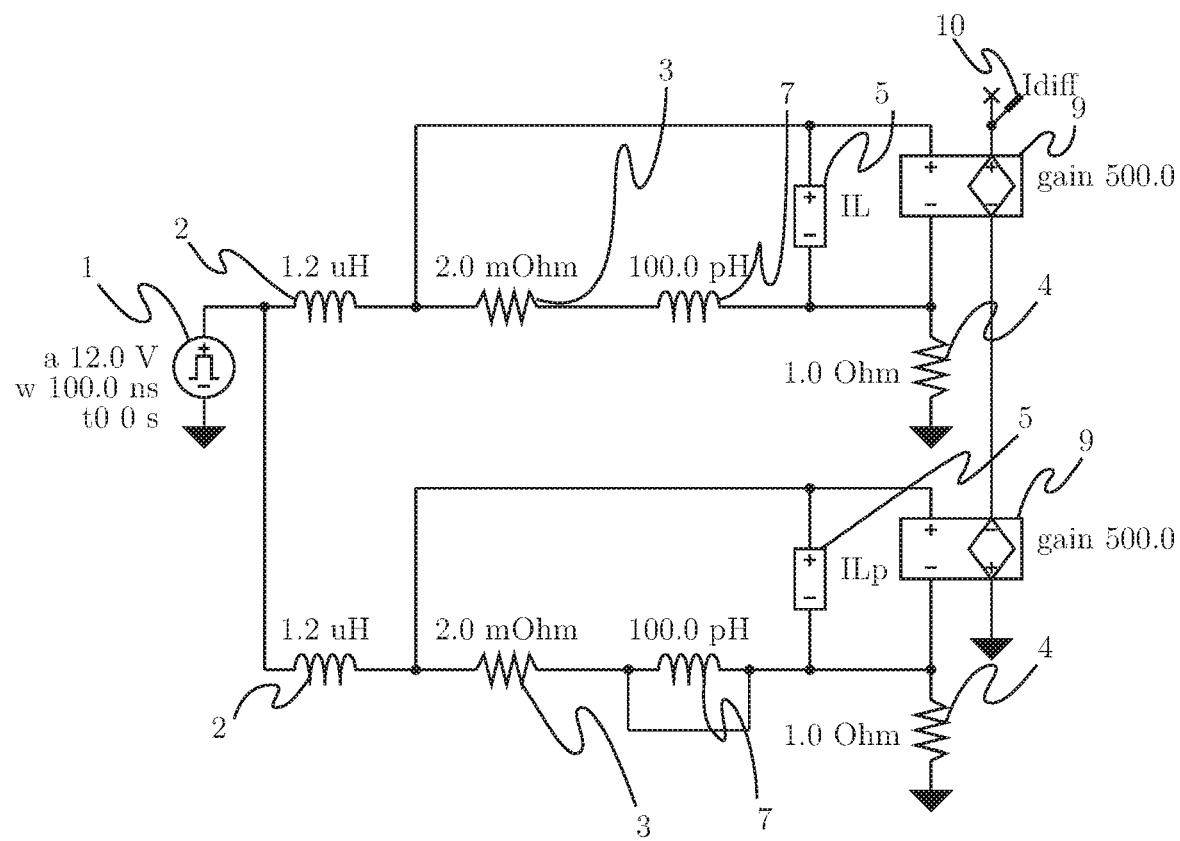
FIG. 5 is a schematic measuring the difference between the correct current sense waveform and the incorrect current sense waveform affected by parasitic inductance.

FIG. 5 is a schematic measuring the difference between the correct current sense waveform and the incorrect current sense waveform affected by parasitic inductance. The schematic depicts multiple devices, referred to as a voltage controlled voltage source [9], which are utilized in conjunction with an error measurement probe [10] to show the nature and shape of the error. The top portion and the bottom portion of the schematic are the same, albeit the parasitic inductance [7] is bypassed on the bottom portion.

Figure 6:
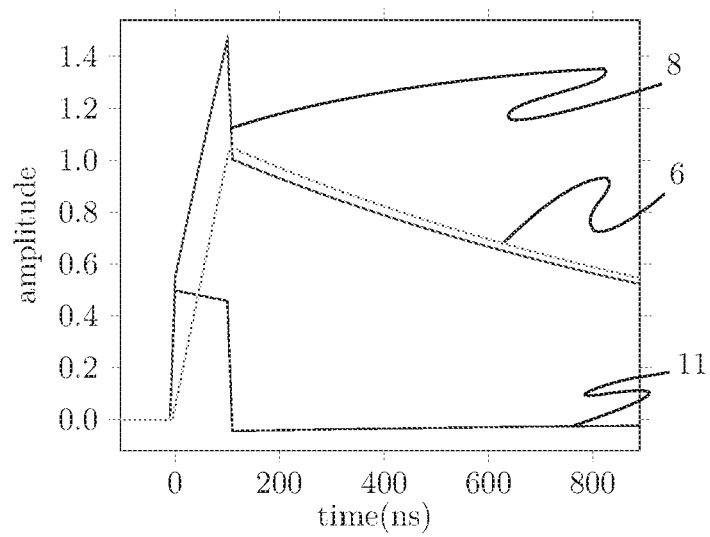
FIG. 6 is a plot showing a difference waveform between correct and incorrect current sense waveforms.

FIG. 6 is a plot showing a difference waveform between correct and incorrect current sense waveforms. The waveforms may be generated from a simulation of the schematic depicted in FIG. 5. The plot depicted in FIG. 6 includes an error waveform [11] showing that the difference is nearly a pulse. The error waveform [11] demonstrates that the erroneous current sense waveform [8], generated assuming no parasitic inductance, differs from the ideal saw-tooth shaped desired current sense waveform [6] by nearly a pure pulse. The nature of the difference may be accounted for during compensation, as described further below.

3. Current Sense Resistor Compensation Using Virtual Probing

In one or more embodiments, virtual probing is used to compensate for the effect of parasitics associated with a sense resistor. Virtual probing involves the description of a measurement problem schematically providing an actual measurement taken and query the system to solve for a desired measurement situation. More information about virtual probing is provided in "Virtual Probing and Probe Compensation", U.S. Pat. Nos. 7,660,685 and 8,170,820 to Pupalaikis, et al., which were previously incorporated by reference.

Figure 7:
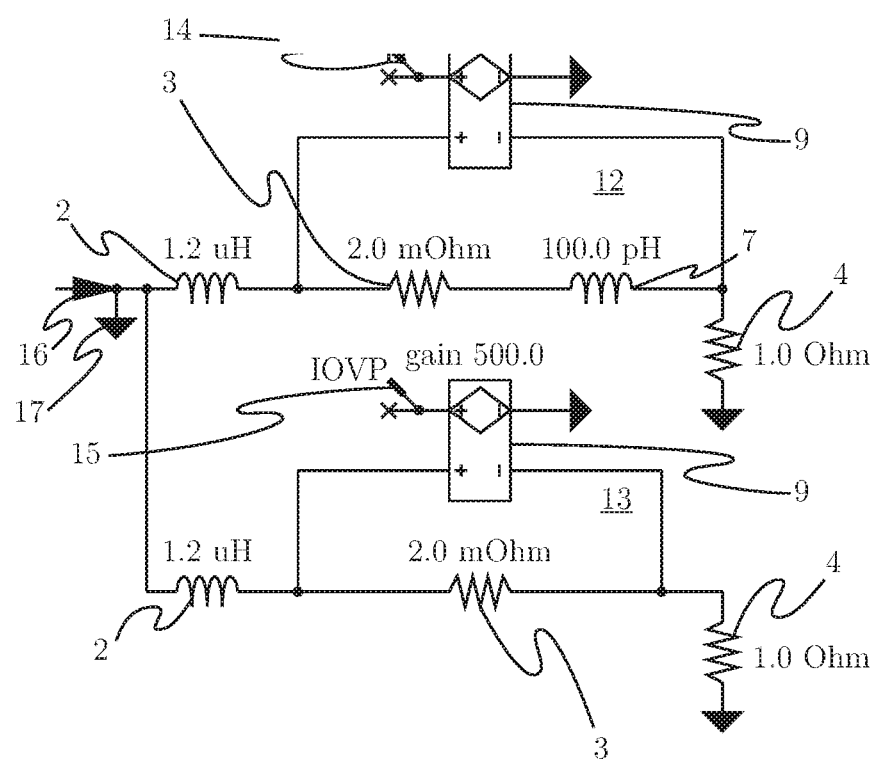
FIG. 7 is a schematic description of a virtual probe measurement in accordance with one or more embodiments.

FIG. 7 is a schematic description of a virtual probe measurement in accordance with one or more embodiments. The virtual probe arrangement may be used to compensate for parasitic inductance that is associated with a sense resistor. Here, the circuit consists of a top circuit portion [12] and a bottom circuit portion [13]. The top circuit portion [12] comprises a circuit for which an actual waveform measurement is made. This actual waveform is made of top circuit portion [12] where a virtual probe measurement probe [14] is shown.

The virtual probe measurement probe [14] may correspond to any physical probe or set of physical probes, such as a differential voltage probe, that is used to capture waveforms in a circuit. The virtual probe measurement probe [14] may be connected to the terminal of a series sense resistor as depicted. Additionally or alternatively, the virtual probe measurement probe [14] may be connected to other terminals within the electronic circuit being tested.

In one or more embodiments, the virtual probe measurement probe [14] is connected to a waveform measuring device. Example waveform measuring devices include, but are not limited to, digital oscilloscopes, analog oscilloscopes, and analyzing recorders. Waveform measuring devices may be used to capture single-shot or recurring signals. The captured waveform may be scaled to convert from a voltage measurement to a current measurement as previously described.

The bottom circuit portion [13] comprises a circuit for which an output, compensated waveform is provided at the location of the virtual probe output probe [15]. As can be seen, the parasitic inductance [7] associated with the series resistor [3] has been removed from the bottom circuit portion [13]. This difference indicates to a virtual probe processor that the effects of the parasitic inductance should be removed from the actual waveform measurement.

The two circuits (i.e., the top circuit portion [12] and the bottom circuit portion [13]) are joined by a device called a stim [16] which provides for a common, singular source of waves in the system emanating from a ground [17]. Due to the typical stiffness of an input voltage supply, ground [17] is a good approximation of the impedance of an input voltage supply, but if the true input supply voltage is known, then a single-port s-parameter block can be utilized providing the return-loss looking into the output of the input supply.

In one or more embodiments, a virtual probe netlist is generated as part of the process to compensate for parasitics. The virtual probe netlist may be generated based on virtual probe schematic. For example, FIG. 8 is a virtual probe netlist corresponding to the schematic in FIG. 7. The virtual probe netlist of FIG. 8 is a text file system description that defines the electrical devices and corresponding connection points within the schematic. These electrical devices and corresponding connection points represent a description of the series resistance and associated parasitics. In particular, the removal of the parasitic inductance [7] from the bottom circuit portion [13], which is included in the top circuit portion [12], indicates that the virtual probe processor should remove the effects of the 100 PH inductance from the actual waveform measurement.

In one or more embodiments, the virtual probe netlist is generated by a computer aided design (CAD) that converts pictorial circuits and system definitions to an equivalent text file definition. The CAD tool may be implemented in software, hardware, or some combination thereof. Additional examples of generating virtual probe netlists are provided in "Virtual Probing and Probe Compensation", U.S. Pat. Nos. 7,660,685 and 8,170,820 to Pupalaikis, et al.

Figure 12:
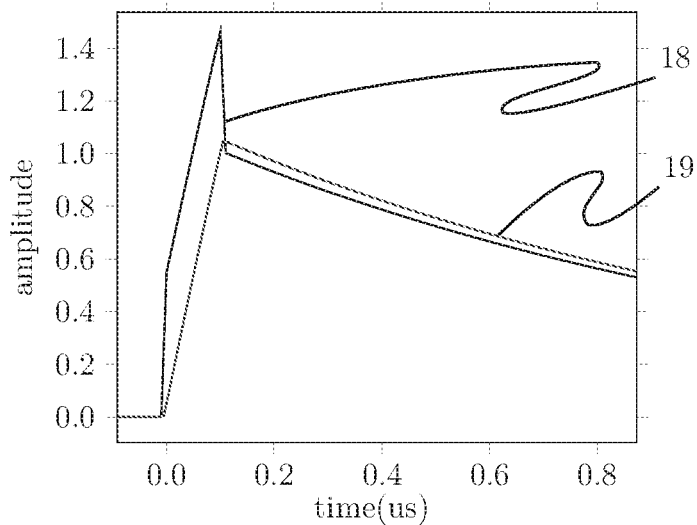
FIG. 12 is a plot showing the measurement and output waveforms for a virtual probe arrangement in accordance with one or more embodiments.

In one or more embodiments, a virtual probe processor is configured to generate an output waveform as a function of a virtual probe measurement waveform. For example, FIG. 12 is a plot showing a virtual probe measurement waveform [18] and a virtual probe output waveform [19]. The virtual probe measurement waveform [18] may correspond to an actual waveform measurement captured by a probe. The virtual probe output waveform [19] may be generated by applying a filter that approximates or otherwise represents a transfer function, where the transfer function is determined based on the provided virtual probe netlist. A virtual probe processor may be implemented using one or more specialized microprocessors, such as digital signal processors (DSPs) or waveform processors. In other scenarios, a virtual probe processor may be implemented by software executing on a general-purpose hardware processor, such as an x86 processor.

Figure 10:
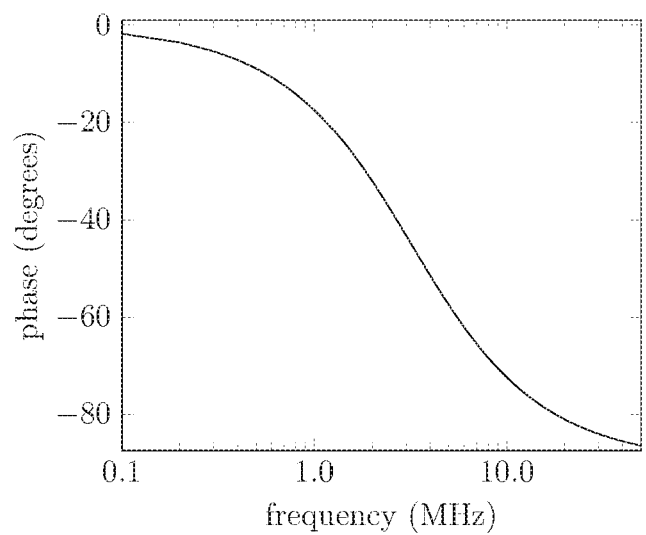
FIG. 10 is a plot of the phase response of a virtual probe transfer function in accordance with one or more embodiments.

FIG. 9 is a plot of the magnitude response of a virtual probe transfer function, and FIG. 10 is a plot of the phase response of the virtual probe transfer function in accordance with one or more embodiments. The transfer function may be computed by a virtual probe processor based on the virtual probe netlist depicted in FIG. 8.

Figure 11:
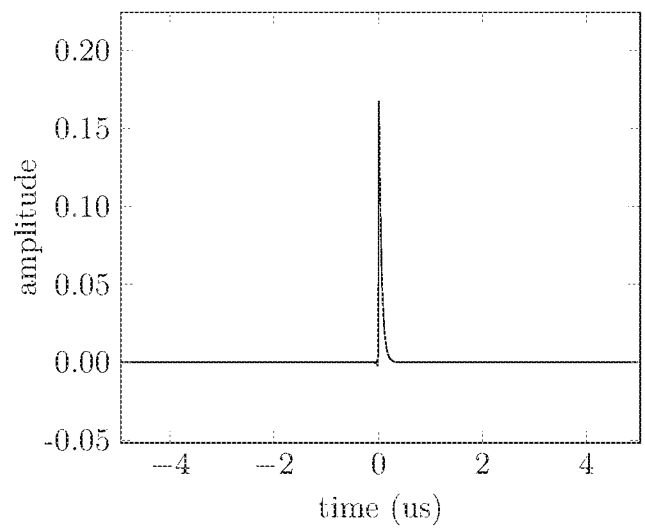
FIG. 11 is a plot of the impulse response of a virtual probe transfer function in accordance with one or more embodiments.

FIG. 11 is a plot of the impulse response of the virtual probe transfer function in accordance with one or more embodiments. The impulse response provides the possibility of compensating a virtual probe measurement waveform [18] by passing the waveform through a finite-impulse-response (FIR) filter. Alternately, a filter with given filter elements could be fit to the response shown in FIG. 9 and FIG. 10 to develop an infinite-impulse-response (IIR) filter solution. The transfer function in FIG. 9 and FIG. 10 very closely approximates an RC network, so this type of filter can be used, as well. The transfer function acts as a filter to remove Fourier components in the waveform introduced by the parasitic inductance [7].

Referring again to FIG. 12, the virtual probe output waveform [19] resulting from virtual probing of the virtual probe measurement waveform [18]. The virtual probe output waveform [19] is generated by a virtual probe processor by applying a filter to the virtual probe measurement waveform [18] that approximates the transfer function depicts in FIGS. 9, 10, and 11. As can be seen, the compensated virtual probe output waveform [19] is similar in shape to the desired current sense waveform [6].

The examples above relate to compensating for parasitic inductance that is within or associated with a sense resistor that is the subject of a waveform measurement. The technique is applicable for parasitics other than just inductance. In the virtual probe arrangement in FIG. 7, the series resistor [3] and parasitic inductance [7] in the top circuit portion [12] can be replaced by any equivalent network representing the known measurement conditions to solve for and compensate for a variety of situations. The equivalent network may include, without limitation, parasitic impedance, capacitance, inductance, or any combination thereof. The virtual probe netlist may be generated by including the parasitic components in the top circuit portion [12] and removing these components in the bottom circuit portion [11]. A virtual probe netlist may be generated based on the schematics. A virtual probe processor may then apply a filter/ transfer function to remove unexpected Fourier and/or time-series components from a waveform measurement.

Referring again to FIG. 7, the schematic illustrates two circuit portions with one virtual probe output. However, other arrangements may be used in addition or as an alternative to the bottom circuit portion [13] to compensate for parasitic inductance [7]. For example, one option is to modify the bottom circuit portion [13] by adding the parasitic inductance [7] to the inductor [2] This arrangement may be included as a third circuit, connected to stim [16] and having a separate virtual probe output measuring the voltage across the sense resistor. A virtual probe processor may then generate two separate output waveforms based on the different arrangements: one for bottom circuit portion [13] and another for the alternative arrangement with the slightly increased inductance value for inductor [2]. A user may then select between the two different output waveforms to use as the representation of current in the circuit.

4. Compensation Tuning

The examples above assume that the parasitics are known before compensation. However, in some circumstances, there may be a lack of a priori knowledge of the parasitics. In these cases, a dynamic tuning capability may be provided to compensate for the unknown parasitic values. The tuning capability may update the parasitic values in the virtual probing schematic and netlist until the compensated waveform matches a set of expected characteristics, as will be explained further below.

In one or more embodiments, the tuning capability is provided via a user interface of an instrument providing for such compensation. For example, the user interface may include a dial or knob on an oscilloscope or other waveform measurement device. As another example, the tuning ability may be provided through a GUI or some other display interface of a digital computing device. The user may then tune, trim, or otherwise adjust the parasitic values observing the effect on the compensated waveform. The compensated waveform may be displayed via a screen of the waveform measurement device, and the display of the compensated waveform may be updated in real-time as the user is turning the dial or otherwise tuning the parasitic values through the interface. This allows the user to adjust the assumed parasitic values and near immediately see the result of the update virtual probing output waveform. The user may continue adjusting the assumed parasitic values until the compensated waveform substantially matches the characteristics expected for the measurement.

It is noted that tuning the assumed parasitic values, in the examples set forth herein, does not adjust the actual parasitic inductance for which compensation is desired. Rather, tuning the assumed parasitic values adjusts signal processing parameters in the virtual probe netlist for compensating the effects of the parasitic inductance. The filter applied by a virtual probe processor is computed as a function of the assumed parasitic value. The more closely the assumed parasitic value matches the actual parasitic inductance, the more effective the applied filter at minimizing the effect of the actual parasitic inductance.

In one or more embodiments, tuning may be performed automatically by the instrument providing for such compensation. To automatically tune the values, the instrument may adjust in a manner that minimizes the error waveform [11]. In FIG. 6, the error waveform [11] is very nearly pulse shaped as a result of parasitic inductance [7]. Thus, in a DC-DC power supply under a static load, the expected waveform is almost a perfect saw-tooth waveform and for a pure parasitic inductance, the error waveform is the sum of saw-tooth and pulse train. Thus, the system can be tuned algorithmically by iteratively changing the value of the inductance until the Fourier series components of the waveform most closely approximates those of a sawtooth, nulling the effect of the additive pulse train.

Another technique for automatically tuning the values is to iteratively change the parasitic values until unexpected time-domain characteristics are removed. For example, the parasitic inductance values may be iteratively updated until the time-series discontinuity characterized by pulse train is removed. The result removes sudden spikes in the current waveform that are unexpected and indicative of a measurement error.

Figure 13:
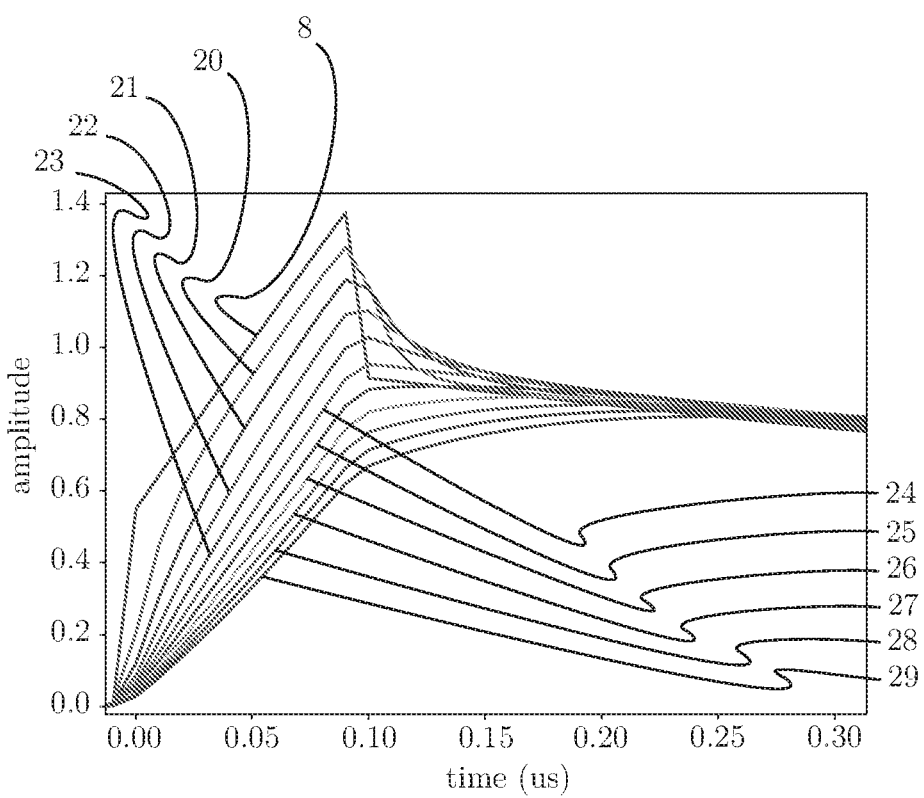
FIG. 13 is a plot showing various virtual probe output waveforms as a function of tuning signal processing parameters to compensate for parasitic inductance in accordance with one or more embodiments.

FIG. 13 is a plot showing various virtual probe output waveforms as a function of tuning signal processing parameters to compensate for parasitic inductance in accordance with one or more embodiments. Here, the value of a parasitic inductance [7] is tuned. FIG. 13 shows a current sense waveform [8] assuming no parasitic inductance, a current sense waveform [20] assuming 20 pH parasitic inductance, a current sense waveform [21] assuming 40 pH parasitic inductance, a current sense waveform [22] assuming 60 pH parasitic inductance, a current sense waveform [23] assuming 80 pH parasitic inductance, a current sense waveform [24] assuming 100 pH parasitic inductance, a current sense waveform [25] assuming 120 pH parasitic inductance, a current sense waveform [26] assuming 140 pH parasitic inductance, a current sense waveform [27] assuming 160 pH parasitic inductance, a current sense waveform [28] assuming 180 pH parasitic inductance and a current sense waveform [29] assuming 200 pH parasitic inductance. Just by visual examination, it is clear that the current sense waveform [24] assuming 100 pH parasitic inductance is correct. Not only does it most closely approximate the desired current sense waveform [6], but the actual desired current sense waveform [6] is probably now known, although the current sense waveform [24] assuming 100 pH parasitic inductance exhibits the least overshoot and undershoot, leading to the correct tuning of the compensation system.

5. Miscellaneous; Extensions

Embodiments are directed to a system with one or more devices that include a hardware processor and that are configured to perform any of the operations described herein and/or recited in any of the claims below.

In an embodiment, a non-transitory computer readable storage medium comprises instructions which, when executed by one or more hardware processors, causes performance of any of the operations described herein and/or recited in any of the claims.

Any combination of the features and functionalities described herein may be used in accordance with one or more embodiments. In the foregoing specification, embodiments have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A method for generating a current waveform, the method comprising:
   connecting a probe to a terminal of a circuit and a waveform measuring device;
   acquiring, by the waveform measuring device through the probe, a voltage waveform;
   generating a virtual probe netlist descriptive of a series resistance and associated parasitics;
   converting, by a virtual probe processor based on the virtual probe netlist, the voltage waveform to the current waveform, wherein the current waveform is representative of a current in the circuit.

2. The method of claim 1, wherein the associated parasitics includes a parasitic inductance and wherein the virtual probe processor compensates for the parasitic inductance based on the virtual probe netlist to generate the current waveform.

3. The method of claim 2, further comprising tuning a value representing the parasitic inductance in the virtual probe netlist until unexpected characteristics associated with the parasitic inductance are substantially removed.

4. The method of claim 3, wherein the unexpected characteristics include Fourier series components of the current waveform.

5. The method of claim 3, wherein the unexpected characteristics include time-domain discontinuities.

6. The method of claim 1, wherein the associated parasitics includes a parasitic capacitance and wherein the virtual probe processor compensates for the parasitic capacitance based on the virtual probe netlist to generate the current waveform.

7. The method of claim 1, wherein the circuit is a power converter, the method further comprising tuning a value representing at least one parasitic in the virtual probe netlist until unexpected characteristics associated with a power converter are substantially removed.

8. The method of claim 1, further comprising receiving, through a user interface, an adjustment to at least one value approximating the associated parasitics; and in response to receiving, through the user interface, the adjustment to the at least one value, updating the virtual probe netlist and the current waveform.

9. The method of claim 1, wherein converting the voltage waveform comprises applying a filter that is generated as a function of the virtual probe netlist.

10. A system for generating a current waveform, the system comprising:
    a probe that is connected to a terminal of a circuit;
    a waveform measuring device connected to the probe that acquires, through the probe, a voltage waveform;
    a virtual probe processor that receives a virtual probe netlist descriptive of a series resistance and associated parasitics;
    wherein the virtual probe processor converts, based on the virtual probe netlist, the voltage waveform to the current waveform;
    wherein the current waveform is representative of a current in the circuit.

11. The system of claim 10, wherein the associated parasitics includes a parasitic inductance and wherein the virtual probe processor compensates for the parasitic inductance based on the virtual probe netlist to generate the current waveform.

12. The system of claim 11, wherein the virtual probe processor further tunes a value representing the parasitic inductance in the virtual probe netlist until unexpected characteristics associated with the parasitic inductance are substantially removed.

13. The system of claim 12, wherein the unexpected characteristics include Fourier series components of the current waveform.

14. The system of claim 12, wherein the unexpected characteristics include time-domain discontinuities.

15. The system of claim 10, wherein the associated parasitics includes a parasitic capacitance and wherein the virtual probe processor compensates for the parasitic capacitance based on the virtual probe netlist to generate the current waveform.

16. The system of claim 10, wherein the circuit is a power converter, wherein the virtual probe processor further tunes a value representing at least one parasitic in the virtual probe netlist until unexpected characteristics associated with a power converter are substantially removed.

17. The system of claim 10, further comprising a user interface for adjusting at least one value approximating the associated parasitics; wherein in response to receiving, through the user interface, an adjustment to the at least one value, the virtual probe processor updates the current waveform.

18. The system of claim 10, wherein virtual probe process converts the voltage waveform by applying a filter that is generated as a function of the virtual probe netlist.

19. An apparatus for generating a current waveform, the apparatus comprising:
    a probe input that includes or connects to a probe for connecting to a terminal of a circuit;
    a waveform processor connected to the probe input that acquires, through the probe, a voltage waveform; and
    a virtual probe processor that receive a virtual probe netlist descriptive of a series resistance and associated parasitics and converts, based on the virtual probe netlist, the voltage waveform to a current waveform representative of current in the circuit.

20. The apparatus of claim 19, further comprising a know or a dial that tunes a value representing the associated parasitics when turned causing the virtual probe processor to update the current waveform representative of the current in the circuit.

\* \* \* \* \*